US006800503B2

(12) United States Patent
Kocis et al.

(10) Patent No.: US 6,800,503 B2
(45) Date of Patent: Oct. 5, 2004

(54) MEMS ENCAPSULATED STRUCTURE AND METHOD OF MAKING SAME

(75) Inventors: Joseph T. Kocis, Pleasant Valley, NY (US); James Tornello, Cortlandt Manor, NY (US); Kevin S. Petrarca, Newburgh, NY (US); Richard Volant, New Fairfield, CT (US); Seshadri Subbanna, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/300,520

(22) Filed: Nov. 20, 2002

(65) Prior Publication Data

US 2004/0097003 A1 May 20, 2004

(51) Int. Cl.[7] .......................... H01L 21/00; H01L 21/44
(52) U.S. Cl. ......................... 438/52; 438/125; 438/126; 438/127; 438/55; 438/25; 438/26; 438/723; 333/219; 333/235; 280/735; 257/214
(58) Field of Search .......................... 438/52, 125, 126, 438/127, 55, 25, 26, 723, 51, 64, 48, 50; 333/219, 235, 101, 105, 262; 280/735; 257/214, 421, 422, 414, 415; 216/2

(56) References Cited

U.S. PATENT DOCUMENTS

| | | | |
|---|---|---|---|
| 5,786,621 A | 7/1998 | Saif et al. | |
| 6,016,693 A | 1/2000 | Viani et al. | |
| 6,046,066 A * | 4/2000 | Fang et al. | 438/52 |
| 6,051,866 A | 4/2000 | Shaw et al. | |
| 6,069,540 A | 5/2000 | Berenz et al. | |
| 6,073,484 A | 6/2000 | Miller et al. | |
| 6,149,190 A | 11/2000 | Galvin et al. | |
| 6,667,245 B2 * | 12/2003 | Chow et al. | 438/723 |
| 2002/0151132 A1 * | 10/2002 | Hsu et al. | 438/241 |
| 2002/0163051 A1 * | 11/2002 | Gopal et al. | 257/414 |
| 2003/0119221 A1 * | 6/2003 | Cunningham et al. | 438/52 |
| 2003/0138988 A1 * | 7/2003 | Bruner | 438/52 |
| 2003/0148550 A1 * | 8/2003 | Volant et al. | 438/52 |

* cited by examiner

Primary Examiner—Matthew Smith
Assistant Examiner—Belur Keshavan
(74) Attorney, Agent, or Firm—Steven Capella, Esq.; McGinn & Gibb, PLLC

(57) ABSTRACT

A method of fabricating an encapsulated micro electro-mechanical system (MEMS) and making of same that includes forming a dielectric layer, patterning an upper surface of the dielectric layer to form a trench, forming a release material within the trench, patterning an upper surface of the release material to form another trench, forming a first encapsulating layer that includes sidewalls within the another trench, forming a core layer within the first encapsulating layer, and forming a second encapsulating layer above the core layer, where the second encapsulating layer is connected to the sidewalls of the first encapsulating layer. Alternatively, the method includes forming a multilayer MEMS structure by photomasking processes to form a first metal layer, a second layer including a dielectric layer and a second metal layer, and a third metal layer. The core layer and the encapsulating layers are made of materials with complementary electrical, mechanical and/or magnetic properties.

31 Claims, 6 Drawing Sheets

MEMS ENCAPSULATED STRUCTURE AND METHOD OF MAKING SAME

BACKGROUND OF THE INVENTION

1. Field of the Invention

The present invention generally relates to an encapsulated micro electro-mechanical system (MEMS) and methods of making the encapsulated MEMS. In particular, the present invention generally relates to a MEMS structure having an encapsulating layer of a material with different electrical, mechanical and/or magnetic properties from those of a core material, where the encapsulated MEMS structure may be made by complementary metal oxide semiconductor (CMOS) compatible methods.

2. Description of the Related Art

One example of a commonly used MEMS structure is a radio frequency (RF) switch, such RF switches are used in various microwave and millimeter wave applications, such as, tunable preselectors and frequency synthesizers. Semiconductor RF switches are relatively large and bulky, for example, 400 in$^3$ for a 16×16 array, making packaging sizes for such an array relatively large. Micro-machined RF switches significantly reduce package sizes for such RF switch arrays, for example, down to approximately 1 in$^3$.

Figure 1:
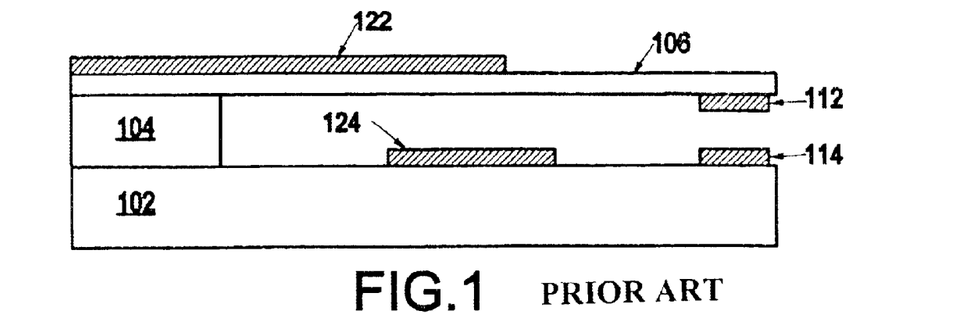
FIG. 1 illustrates a conventional MEMS RF switch.

FIG. 1 illustrates a commonly used RF switch 100, formed as a monolithically integrated MEMS switch, including a substrate 102, a support 104, and a flexible cantilever beam 106 that is attached at one end to the support 104. The cantilever beam 106 has an electrical contact 112 at its unsupported end, which contacts an underlying contact 114 on the surface of the substrate 102. Electrical contact 114 is usually connected to an RF input signal and forms an RF input port of the RF switch, while the electrical contact 112 forms an RF output port.

The RF switch 100 is actuated by electrostatic forces between a field plate 122 formed on the upper surface of the cantilever beam 106 and a grounding plate 124 located on the surface of the substrate 102. The field plate is connected to a direct current (DC) voltage source, while the grounding plate 124 is connected to ground. As illustrated in FIG. 1, when no voltage is applied to the field plate 122, the electrical contact 112 is separated from electrical contact 114, defining an open contact or OFF state. However, when an appropriate DC voltage is applied to the field plate 122, the flexible cantilever beam 106 is deflected by electrostatic forces, causing the electrical contact 112 to contact electrical contact 114, defining a closed contact or ON state. The closed contact or ON state allows the RF input signal to be electrically connected to the RF output port. When the applied voltage is removed from the field plate 122, the flexible cantilever arm 106 returns to its open contact or OFF state, due to elastic forces inherent to the material of the cantilever beam 106.

However, such cantilever beams are subject to mechanical fatigue and stress, when switched on and off a large number of times. Sometimes, due to prolonged mechanical stress, the cantilever beam will deform and may then be subject to stiction at the electrical contact.

In addition, conventional RF switches that use silicon dioxide, polysilicon or even a composite silicon metal alloy as the beam material, are subject to relatively high insertion losses, which result in reduced sensitivity of the RF switch.

Furthermore, conventional MEMS RF switches frequently use polysilicon beams with electroless plated gold or copper. However, the use of electroless gold plating poses problems during conventional CMOS fabrication processes because there is usually no provision for depositing polysilicon or other similar materials, once a back end of line process, such as, the plating of copper, is started. With no provision for a subsequent front end of line process, electroless plating produces a very rough copper structure that is not passivated to prevent oxidation, electro-migration, and diffusion.

SUMMARY OF THE INVENTION

In view of the foregoing and other problems and disadvantages of conventional methods, an advantage of the present invention is to provide an encapsulated MEMS forming an RF switch that may be made of multiple materials, having complementary electrical and mechanical properties, to, for example, reduce metal fatigue and stress during prolonged operation, prevent stiction, and reduce insertion losses.

Another advantage of the present invention is to provide encapsulated MEMS structures that provide various switch structures, such as, encapsulated cantilever beams, encapsulated cantilever beams with one or more electrically-isolated lengths, encapsulated beams fixed at both ends, and encapsulated beams fixed at both ends with one or more electrically-isolated encapsulated lengths. In addition, the encapsulated MEMS may accommodate various numbers of switch contacts and grounding plates and a variety of switch contact and grounding plate configurations on a dielectric layer underlying, for example, an encapsulated beam.

A further advantage of the present invention is to provide an encapsulated MEMS structure that forms an inductive coil, where either the core material or the encapsulating material may comprise a ferromagnetic material in order to enhance inductive performance.

Another further advantage of the present invention is to provide a method of manufacturing the encapsulated MEMS structure that is compatible with CMOS compatible methods.

An additional advantage of the present invention is to provide a method of manufacturing an encapsulated MEMS structure that allows the use of various barrier metals, such as, gold, platinum, palladium, iridium, tungsten, tungsten nitride, tantalum, tantalum nitride, titanium, titanium nitride and nickel, for encapsulating the MEMS structure, which allows the passivation of an encapsulated inner copper layer and prevents oxidation, electro-migration and diffusion of the copper during subsequent processing.

In order to attain the above and other advantages, according to an exemplary embodiment of the present invention, disclosed herein is a method of fabricating an encapsulated MEMS that includes forming a dielectric layer on a semiconductor substrate, patterning an upper surface of the dielectric layer to form a first trench, forming a release material within the first trench, patterning an upper surface of the release material to form a second trench, forming a first encapsulating layer including sidewalls within the second trench, forming a core layer within the first encapsulating layer, and forming a second encapsulating layer above the core layer in which the second encapsulating layer is connected to the sidewalls of the first encapsulating layer.

According to another exemplary embodiment of the present invention, the first encapsulating layer and the second encapsulating layer are made of barrier metals selected from the group of gold, platinum, palladium, iridium, tungsten, tungsten nitride, tantalum, tantalum nitride, titanium, titanium nitride, and nickel, while the core layer is made of a semiconductor dielectric material.

According to another exemplary embodiment of the present invention, the method of fabricating an encapsulated MEMS further includes forming a metal layer between the first encapsulating layer and the core layer.

According to another exemplary embodiment of the present invention, the metal layer includes sidewalls that are connected to the second encapsulating layer.

According to another exemplary embodiment of the present invention, forming the metal layer includes depositing an initial metal layer including sidewalls on the first encapsulating layer, depositing a stop layer on exposed surfaces of at least the first encapsulating layer and the sidewalls of the initial metal layer, removing the stop layer located above the sidewalls of the initial metal layer, and recessing the sidewalls of the initial metal layer and of that portion of the stop layer, which adheres to the sidewalls of the initial metal layer.

According to another exemplary embodiment of the present invention, the metal layer comprises a highly conductive metal from the group of copper, gold and aluminum.

According to another exemplary embodiment of the present invention, forming the core layer includes depositing a stop layer on exposed surfaces of at least the first encapsulating layer and the metal layer, depositing a semiconductor dielectric material on the stop layer, planarizing the semiconductor dielectric material to the level of the stop layer, and recessing the semiconductor dielectric material to a level beneath that of the upper surface of the release material to form the core layer.

According to another exemplary embodiment of the present invention, the method of fabricating an encapsulated MEMS further includes forming at least one switch contact and at least one grounding plate on that portion of the dielectric layer that forms a bottom surface of the first trench.

According to another exemplary embodiment of the present invention, removing the release material results in forming a cantilever beam, including at least the first encapsulating layer, the core layer, and the second encapsulating layer, over a bottom surface of the first trench.

According to another exemplary embodiment of the present invention, removing the release material results in forming a beam, supported at both ends, over a bottom surface of the first trench.

According to another exemplary embodiment of the present invention, the first trench and the second trench form coil patterns having two ends, in which an encapsulated inductive coil is formed and removing the release material results in the encapsulated inductive coil being positioned over a lower portion of the dielectric layer and being supported at both ends by higher portions of the dielectric layer.

According to another exemplary embodiment of the present invention, the first encapsulating layer and the second encapsulating layer comprise a ferromagnetic material and the core layer comprises a semiconductor dielectric material or a metal.

According to another exemplary embodiment of the present invention, the first encapsulating layer and the second encapsulating layer include a semiconductor dielectric material or a metal and the core layer includes a ferromagnetic material.

According to another exemplary embodiment of the present invention, a method of fabricating a multilayered metal encapsulated structure for a MEMS, includes forming a base dielectric layer on a semiconductor substrate, patterning an upper surface of the base dielectric layer to form a trench, forming a release material within the trench, forming a first dielectric layer within the release material, patterning the first dielectric layer to form at least two separate trenches along the long axis of the first trench, forming a first metal layer in the at least two separate trenches, forming a second dielectric layer on at least the first metal layer, patterning the second dielectric layer to form two side trenches that contact the first metal layer while retaining a central portion of the second dielectric layer between the two side trenches, forming a second metal layer within the two side trenches, removing areas of the second dielectric layer that surround portions of the multilayered metal encapsulated structure, filling the areas with the release material, forming a third dielectric layer on at least the second metal layer and the central portion of the second dielectric layer, patterning another trench in the third dielectric layer that corresponds to a pattern of the first metal layer and contacts the second metal layer, forming a third metal layer within the another trench of the third dielectric layer, patterning the third dielectric layer to provide access to the release material, and removing the release material to provide the multilayered metal encapsulated structure, a portion of which is separate from and overlies the first dielectric layer.

According to another exemplary embodiment of the present invention, each of the first metal layer, the second metal layer and the third metal layer includes a barrier metal from the group of gold, platinum, palladium, iridium, tungsten, tungsten nitride, tantalum, tantalum nitride, titanium, titanium nitride and nickel.

According to another exemplary embodiment of the present invention, the method of fabricating the multilayered metal encapsulated structure for a MEMS further includes forming at least one switch contact and at least one grounding plate on that portion of the first dielectric layer that forms a bottom surface of the trench.

According to another exemplary embodiment of the present invention, removing the release material results in forming a cantilever beam over a bottom surface of the first trench.

According to another exemplary embodiment of the present invention, removing the release material results in forming a beam, supported at both ends, over a bottom surface of the first trench.

According to another exemplary embodiment of the present invention, the first trench forms a coil pattern having two ends, and each of the first metal layer, the second metal layer and the third metal layer includes a ferromagnetic material.

According to another exemplary embodiment of the present invention, removing the release material results in forming an inductive coil over a lower portion of the dielectric layer, in which the inductive coil is supported at both ends.

According to another exemplary embodiment of the present invention, a method of fabricating a multilayered metal encapsulated structure, including an electrically-isolated metal encapsulation, for a MEMS includes forming a first dielectric layer on a semiconductor substrate, patterning an upper surface of the first dielectric layer to form a first trench, forming a release material within the first trench, patterning an upper surface of the release material to form at least two separate second trenches along the long axis of the first trench, forming a first metal layer within the at least two separate second trenches, forming a second dielectric layer on at least the first metal layer, patterning the second dielectric layer over each of the at least two separate second trenches to form two side trenches that contact the first metal layer while retaining a central portion of the second dielectric layer between the two side trenches, forming a second metal layer within the two side trenches for each of the at least two separate trenches, removing areas of the second dielectric layer that surround portions of the multilayered metal encapsulated structure, filling the areas with the release material, forming a third dielectric layer on at least the second metal layer and the central portion of the second dielectric layer, patterning a third trench in the third dielectric layer that corresponds to a pattern of the first metal layer and contacts the second metal layer, forming a third metal layer within the third trench, patterning the third dielectric layer to provide access to the release material, and removing the release material to provide the multilayered metal encapsulated structure, a portion of which is separate from and overlies the first dielectric layer.

According to another exemplary embodiment of the present invention, each of the first metal layer, the second metal layer and the third metal layer comprises a barrier metal from the group of gold, platinum, palladium, iridium, tungsten, tungsten nitride, tantalum, tantalum nitride, titanium, titanium nitride and nickel.

According to another exemplary embodiment of the present invention, the method of fabricating the multilayered metal encapsulated structure, including an electrically-isolated metal encapsulation, for a MEMS further includes forming at least one switch contact and at least one grounding plate on those portions of the dielectric layer that form bottom surfaces of the at least two separate second trenches.

According to another exemplary embodiment of the present invention, removing the release material results in forming a cantilever beam over at least bottom surfaces of the first trench.

According to another exemplary embodiment of the present invention, removing the release material results in forming a beam that is supported at both ends over a bottom surface of the first trench.

According to another exemplary embodiment of the present invention, an encapsulated MEMS includes a dielectric layer formed on a substrate that includes a portion of lesser thickness and at least one portion of a greater thickness, an encapsulated beam where at least one of both ends of the encapsulated beam is supported above the portion of the dielectric layer having a lesser thickness by the corresponding at least one portion of the dielectric layer having a greater thickness, a encapsulating layer that encapsulates the encapsulated beam, and a core layer formed within the encapsulating layer.

According to another exemplary embodiment of the present invention, the encapsulated MEMS further includes a metal layer formed between the encapsulating layer and the core layer, and a stop layer formed between the metal layer and the core layer.

According to another exemplary embodiment of the present invention, the metal layer and the stop layer include sidewalls that are connected to the encapsulating layer.

According to another exemplary embodiment of the present invention, the encapsulated MEMS further includes at least one switch contact and at least one grounding plate on the portion of the dielectric layer having a lesser thickness.

According to another exemplary embodiment of the present invention, the encapsulated beam comprises an encapsulated portion, which includes the encapsulating layer and the core layer, and an electrically-isolating portion, which includes the core layer and is devoid of the encapsulating layer.

According to another exemplary embodiment of the present invention, the encapsulated beam forms a coil pattern, and either the core layer or the encapsulating layer includes a ferromagnetic material.

BRIEF DESCRIPTION OF THE DRAWINGS

The foregoing and other advantages and aspects of the present invention will be better understood from the following detailed description of preferred embodiments of the invention with reference to the drawings, in which.

DETAILED DESCRIPTION OF PREFERRED EMBODIMENTS OF THE INVENTION

Referring to FIGS. 2A–7B of the present invention, the encapsulated MEMS and the method of fabricating the encapsulated MEMS in various exemplary embodiments of the present invention are described below.

Generally, the present invention takes advantage of fabricating an encapsulated MEMS structure, where the encapsulating materials have complementary electrical, mechanical and/or magnetic properties from those of a core material. For example, the method allows the fabrication of a MEMS RF switch utilizing a cantilever beam, which has a silicon dioxide core surrounded by a metal encapsulation. Such a structure provides a mechanically strong durable beam that may be deflected to allow electrical contact between the electrically conductive metal encapsulation and other switch contacts of the MEMS RF switch. In addition, a MEMS RF switch, utilizing a beam fixed at both ends, may include lengths of metal encapsulation along the beam that are electrically isolated from one another, allowing, for example, a first length of metal encapsulation to contact a control voltage and a second length of metal encapsulation to contact an RF input signal. Furthermore, the encapsulated MEMS structure may form an inductive coil, where either the core material or the encapsulating material may include a ferromagnetic material in order to enhance performance.

Figure 2A:
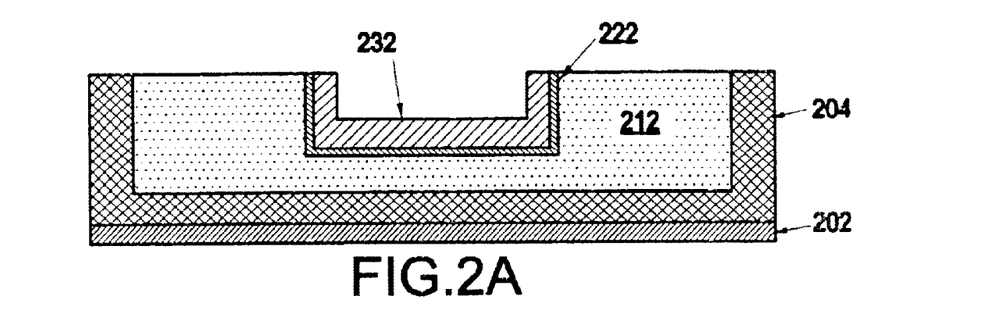
FIG. 2A illustrates a patterned dielectric layer 204 in which a trench is formed, a release material 212 is formed within the trench, a first encapsulating layer 222 is formed within the release material 212, and a metal layer 232 is formed within the first encapsulating layer 222 in an exemplary embodiment of the present invention.

Referring to FIG. 2A, a dielectric layer 204, preferably made of silicon dioxide, may be formed on a semiconductor substrate 202. In various exemplary embodiments, other dielectric materials well known in the art, for example, silicon nitride, quartz, barium strontium titanate, barium titanate, strontium titanate, combinations of barium titanate and strontium titanate, and even organic compounds, such as, for example, polyimides, may be used as long as the material may be patterned by conventional CMOS fabrication processes. The thickness of the dielectric layer 204 may range, for example, from about a few hundred Angstroms to about a few microns.

In various exemplary embodiments, the dielectric layer 204 may be patterned by processes well known in the art, for example, plasma etching, ion milling or reactive ion etching (RIE), to form, for example, a trench in the upper surface of the dielectric layer 204 as shown in FIG. 2A. In various exemplary embodiments, the trench in the dielectric layer 204 may range from about 0.5 $\mu$m to about 3 $\mu$m in depth, from about 15 $\mu$m to about 100 $\mu$m in width, and from about 20 $\mu$m to 200 $\mu$m in length. Within this trench, the encapsulated portion of the MEMS structure may be subsequently formed.

At the bottom of the trench, which corresponds to an upper surface of the dielectric layer 204, at least one switch contact and at least one grounding plate may be formed, which allow for various numbers of switch contacts and grounding plates and various configurations of the contact switches.

In various exemplary embodiments, the dielectric layer 204 surrounding one or both ends of the trench may not be removed in order to form one or more supports for the encapsulated MEMS structure, which is to be separated from the underlying dielectric layer 204.

Referring to FIG. 2A, a release material 212 may be deposited in the trench of the patterned dielectric layer 204. To this end, a number of release materials may be used, such as, photoresist, polyimide, amorphous carbon, poly(methyl methacrylate), poly-para-xylylene (Parylene), norberene-based materials, such as, BF Goodrich's Unity Sacrificial Polymer, diamond-like carbon, and SiLK, a semiconductor dielectric formed of a polymer resin and manufactured by Dow Chemicals, Inc. In various exemplary embodiments, other release materials well known in the art may be used, provided that these release materials are selected according to the requirements of the release process.

The release material 212 may then be patterned by processes, such as, for example, CMOS compatible methods of photolithography, RIE, and chemical mechanical planarization (CMP), so that the subsequently formed encapsulated portion of the MEMS structure may be released from the underlying dielectric layer 204.

In various exemplary embodiments, a first encapsulating layer 222 may be deposited within the trench of the patterned release material 212 as shown in FIG. 2A by, for example, chemical vapor deposition, sputtering, or other processes well known in the art. The thickness of the first encapsulating layer 222 may range, for example, from about 50 Å to about 1000 Å. The first encapsulating layer 222 may form a portion of an outer encapsulating surface of the encapsulated MEMS structure. In various exemplary embodiments, the first encapsulating layer 222 may comprise a barrier material that prevents oxidation, electromigration, and/or diffusion of a subsequently to be deposited metal layer 232. In various exemplary embodiments, the first encapsulating layer 222 may be made of noble metals, such as, for example, gold, platinum, palladium and iridium, or of refractory metals, such as, for example, tungsten, tungsten nitride, tantalum, tantalum nitride, nickel, and other metals and alloys well known in the art.

Referring to FIG. 2A, the metal layer 232 may then be deposited within the first encapsulating layer 222. In various exemplary embodiments, the metal of the metal layer 232 may be highly conductive, for example, copper or gold, and may comprise other metals, such as, aluminum, or metal alloys well known in the art. The metal layer 232 may range from about 400 Å to about 1500 Å. The metal layer 232 may be formed from a seed plus plated metal, or by other processes well known in the art, such as, for example, chemical vapor deposition, plasma-enhanced vapor deposition and evaporation.

In various exemplary embodiments and as shown in FIG. 2A, the first encapsulating layer 222 and the metal layer 232 may include sidewalls that are about equal to the height of the exposed upper surfaces of the dielectric layer 204 and the release material 212. The heights of the sidewalls of the first encapsulating layer 222 and the metal layer 232 may be determined by, for example, the respective deposition and/or patterning processes for each layer, or by other methods well known in the art, for example, CMP. Alternatively, in various exemplary embodiments, the metal layer 232 may be rectangular in cross section, that is, without possessing the sidewalls of the metal layer 232 shown in FIG. 2A.

Figure 2B:
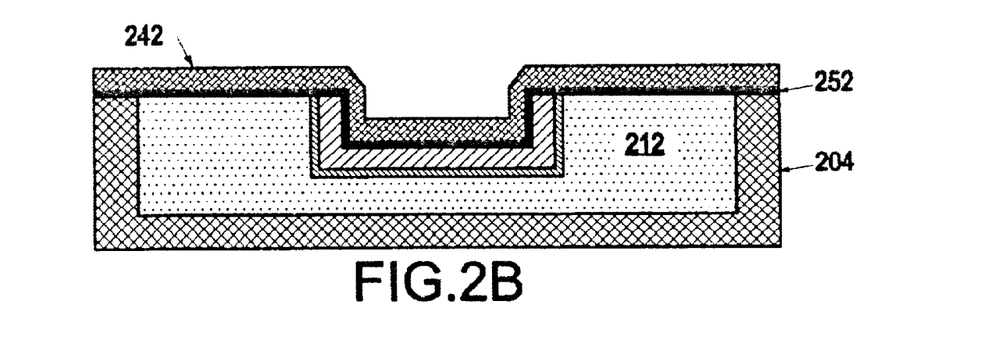
FIG. 2B illustrates a stop 252 and a core 242 deposited over the metal layer 232, the first encapsulating layer 222, the release material 212, and the dielectric layer 204 in an exemplary embodiment of the present invention.

Referring to FIG. 2B, in various exemplary embodiments one or more dielectric layers may, for example, be deposited over the exposed surfaces of the metal layer 232 and the first encapsulating layer 222, and may also be deposited over the release layer 212 and the dielectric layer 204 by, for example, chemical vapor deposition or other processes well known in the art. In various exemplary embodiments, a first of these dielectric layers, as shown in FIG. 2B, may form a stop layer 252, which may stop an etch process. The stop layer 252 may, for example, be about 500 Å in thickness. Preferably, the stop layer 252 may be formed of silicon nitride, but other dielectric materials that provide an etch stop, which are well known in the art, may also be used.

In various exemplary embodiments, a second of these dielectric layers forms a core layer 242, having mechanical and/or electrical properties that differ from the first encapsulating layer 222. The core layer 242 may be deposited over the stop layer 252 as shown in FIG. 2B. The thickness of the core layer 242 may, for example, range from about 500 Å to about a micron or more. In various exemplary embodiments, the core layer 242 may be formed of silicon dioxide or other dielectric materials, such as, for example, silicon nitride, which are well known in the art.

Figure 2C:
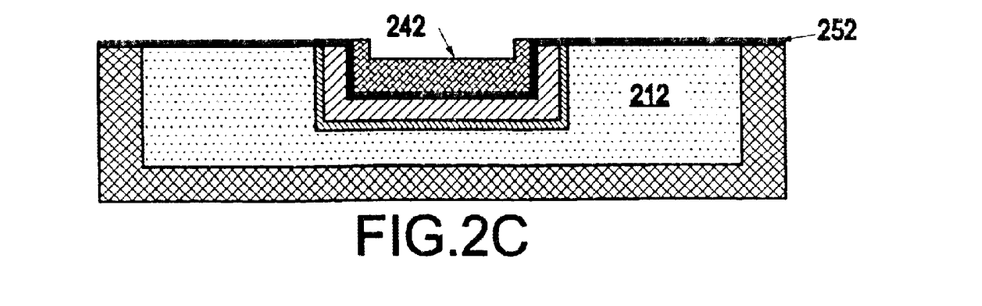
FIG. 2C illustrates polishing the core layer 242 to a depth of the stop layer 252 in an exemplary embodiment of the present invention.

Referring to FIG. 2C, in various exemplary embodiments, the core layer 242 may be planarized by, for example, CMP, to the depth of the stop layer 252, which overlies the upper surfaces of the dielectric layer 204 and the release material 212. In another exemplary embodiment, the core layer 242, itself, may be planarized to a height less than that of the upper surface of the dielectric layer 204 and the release material 212 to form a core layer 242 with a rectangular cross section by, for example, CMP, RIE and other processes well known in the art.

Figure 2D:
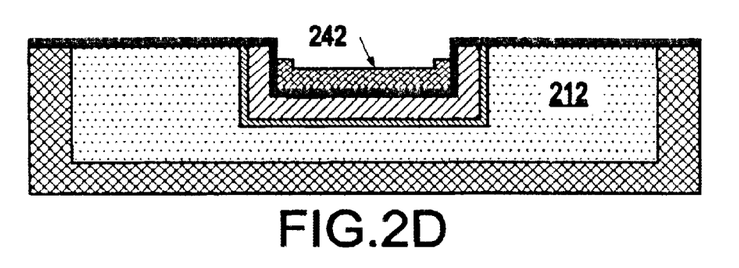
FIG. 2D illustrates recessing the core layer 242 in an exemplary embodiment of the present invention.

Referring to FIG. 2D, a portion of the core layer 242, which constitutes sidewalls of the core layer 242 may, for example, be recessed by RIE or other processes well known in the art. In various exemplary embodiments, the sidewalls removed from the core layer 242, as shown, for example, in FIG. 2D, may be recessed to a depth of about 250 Å to about 700 Å. This recessed depth may provide space for a second encapsulating layer 262, to be subsequently deposited, that forms a top portion of the encapsulated structure.

Figure 2E:
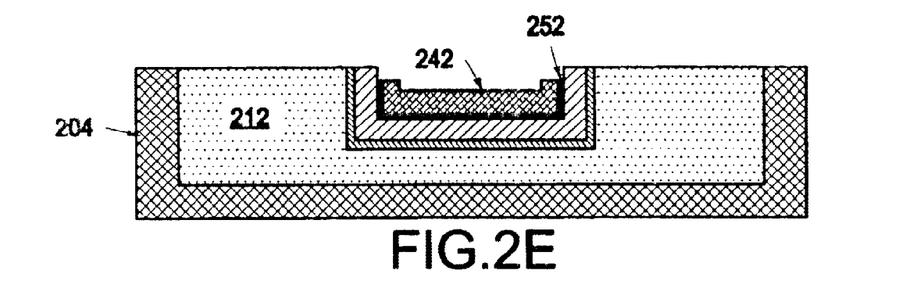
FIG. 2E illustrates recessing the stop layer 252 in an exemplary embodiment of the present invention.

Referring to FIG. 2E, in various exemplary embodiments, the stop layer 252 may be removed from the upper surfaces of the dielectric layer 204, the release material 212, the first encapsulating layer 222, the metal layer 232 and from the inner sidewalls of the metal layer 232, which are exposed above the height of the of the recessed core layer 242. The stop layer 252 may be removed by, for example, RIE and other processes well known in the art.

Figure 2F:
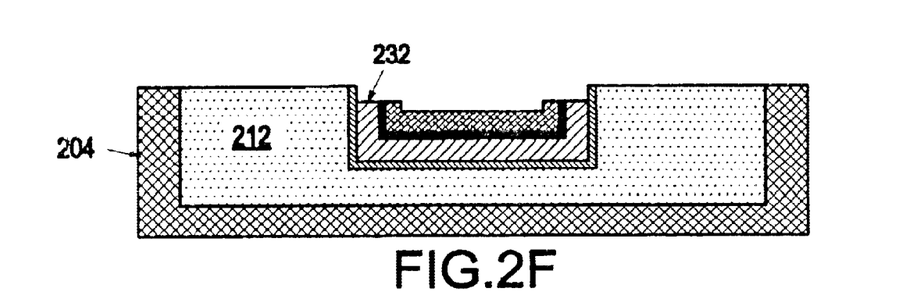
FIG. 2F illustrates recessing the metal layer 232 in an exemplary embodiment of the present invention.

Referring to FIG. 2F, in various exemplary embodiments, a portion of the metal layer 232, which forms the sidewalls of the metal layer 232 within the first encapsulating layer 222, may be removed by, for example, RIE, wet etch or other etching processes well known in the art. Removing the sidewalls of the metal layer 232 may, for example, form a recessed depth of about 250 Å to about 700 Å, which may correspond to the depth of the recessed core layer 242. This recessed depth of the metal layer 232 may also provide space for a second encapsulating layer 262, to be subsequently deposited, that forms a top portion of the encapsulation.

In another exemplary embodiment, the metal layer 232, itself, may be planarized to form a metal layer 232 with a rectangular cross section (not shown), which is formed on the first encapsulating layer 222 and which lies beneath the core layer 242. Such a metal layer would not physically connect with a second encapsulating layer 262, which is to be subsequently deposited.

Figure 2G:
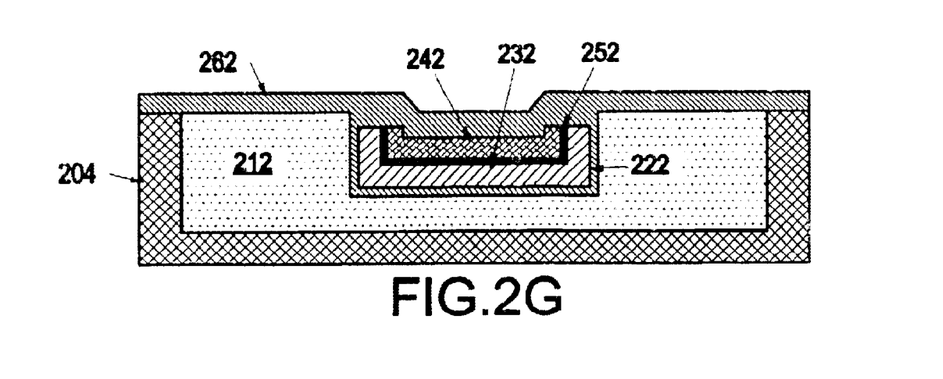
FIG. 2G illustrates depositing a second encapsulating layer 262 over the release material 212, the first encapsulating layer 222, the metal layer 232, the stop layer 252 and the core layer 242 in an exemplary embodiment of the present invention.

Referring to FIG. 2G, in various exemplary embodiments, the second encapsulating layer 262 may be deposited on the exposed surfaces of the first encapsulating layer 222 and the core layer 242, and, if present, the metal layer 232 and the stop layer 252. In various exemplary embodiments, the second encapsulating layer 262 may be formed of the same material as that of the first encapsulating layer 222 or may be formed of another barrier material, including but not limited to noble metals, tungsten, tungsten nitride, tantalum nitride, titanium, titanium nitride and nickel. In various exemplary embodiments, the second encapsulating layer 262 may, for example, fill the depths above the recessed core layer 242 and may also cover the recessed stop layer 252 and the recessed metal layer 232 to a height about equal to or greater than the heights of the upper surfaces of the release material 212 and the dielectric layer 204.

Figure 2H:
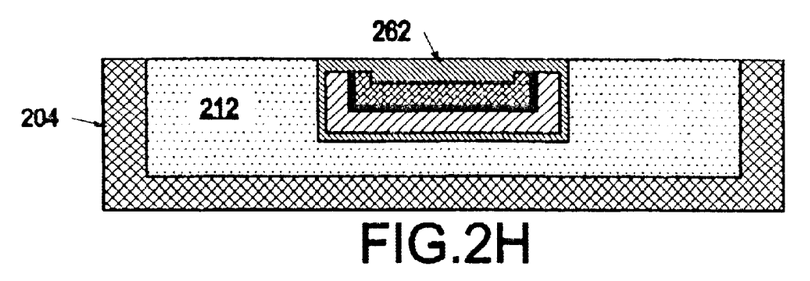
FIG. 2H illustrates polishing of the second encapsulating layer 262 in an exemplary embodiment of the present invention.

Referring to FIG. 2H, the second encapsulating layer 262 may be planarized by, for example, CMP, to a depth corresponding to the upper surfaces of the dielectric layer 204 and the release material 212. By such exemplary embodiments, as discussed above, the encapsulated portion of the encapsulated MEMS structure may be fabricated.

Figure 2I:
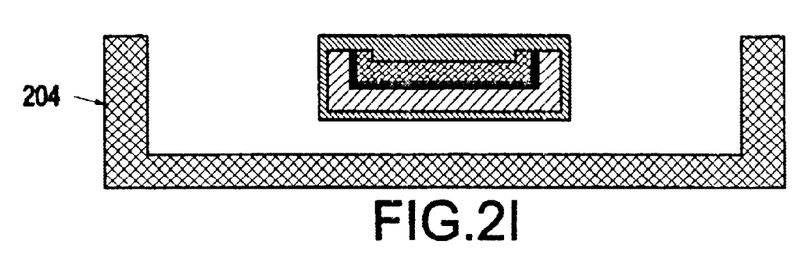
FIG. 2I illustrates removing the release material 212 in an exemplary embodiment of the present invention.

Referring to FIG. 2I, the release material 212 may then be removed to fabricate, for example, an encapsulated beam that overlies and is separated from an underlying portion of the dielectric layer 204. For example, the release material 212 may be removed by exposure to an oxygen plasma, if no oxidizable material is exposed on the encapsulated MEMS structure. Alternatively, an $H_2/CO_2/CO/N_2$ type of plasma may be used, for example, to remove an organic release material, if an oxidizable material is exposed on the encapsulated MEMS structure. Such gas mixtures are well known in the art of RIE.

Figure 3A:
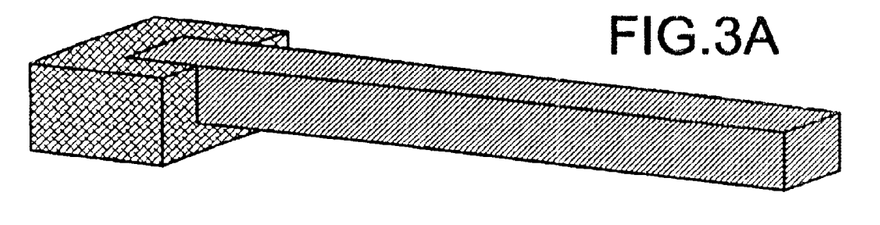
FIG. 3A illustrates an electrically conductive encapsulated cantilever beam in an exemplary embodiment of the present invention.
Figure 3B:
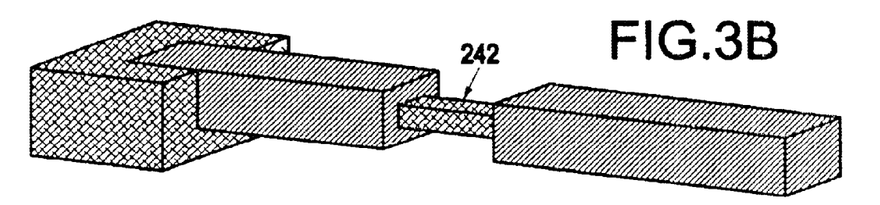
FIG. 3B illustrates two lengths of electrically conductive encapsulation separated by a length of core layer 242 that electrically isolates the two encapsulated lengths in an exemplary embodiment of the present invention.
Figure 3C:
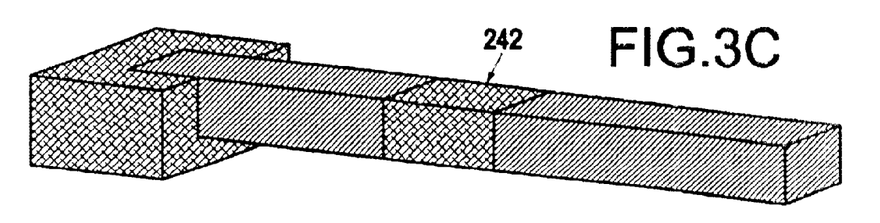
FIG. 3C illustrates two lengths of electrically conductive encapsulation separated by a length of a dielectric material, continuous with the core layer 242, that electrically isolates the two encapsulated lengths in an exemplary embodiment of the present invention.

In various exemplary embodiment, the dielectric layer 204 may be formed to surround but one end of an encapsulated beam, as shown in FIG. 3A, to provide an encapsulated cantilever beam. In such an encapsulated cantilever beam, the first and second encapsulating layers 222, 262 may, for example, be made of a metal, while the core layer 242 is made of a dielectric material. A metal encapsulated cantilever beam may, for example, be formed to provide electrically-isolated lengths of the metal encapsulation, while a dielectric core layer extends throughout the length of the cantilever beam as illustrated in FIGS. 3B and 3C.

As shown in FIGS. 6A–H, an exemplary embodiment of an encapsulated MEMS structure may also be fabricated as a multilayer metal encapsulated MEMS structure by CMOS compatible methods.

Figure 6A:
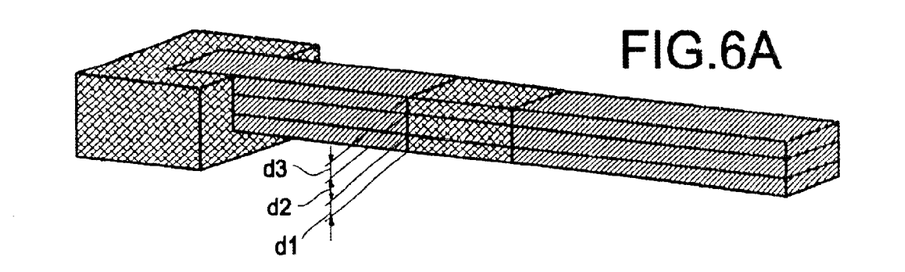
FIG. 6A illustrates a multilayer metal encapsulated MEMS structure that is fabricated by CMOS compatible methods in an exemplary embodiment of the present invention.

In various exemplary embodiments, a trench is patterned in a dielectric layer formed on a semiconductor substrate. A release material may be deposited within the trench as a single layer, above which the encapsulated MEMS structure is to be formed. When the release material is removed from the trench, the encapsulated MEMS structure is separated from the underlying dielectric layer.

Figure 6B:
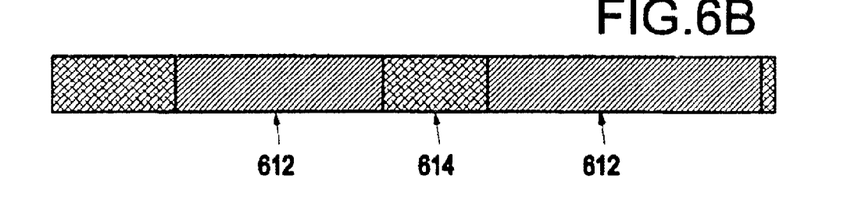
FIG. 6B illustrates a top view of a first layer of the multilayer metal encapsulated MEMS structure of FIG. 6A in an exemplary embodiment of the present invention.

In various exemplary embodiments, a first metal layer 612 as shown in FIG. 6B may be deposited and patterned by, for example, RIE and other processes well known in the art, to form the first metal layer of the encapsulated portion of the MEMS structure.

Figure 6C:
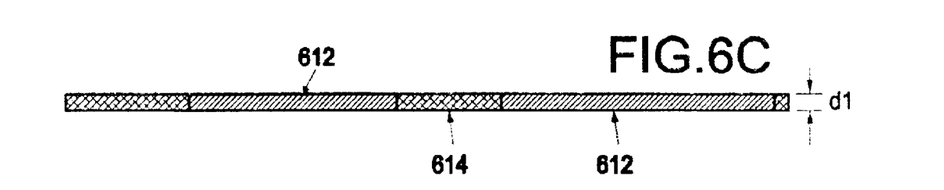
FIG. 6C illustrates a side view of a first layer of the multilayer metal encapsulated MEMS structure of FIG. 6A in an exemplary embodiment of the present invention.
Figure 6D:
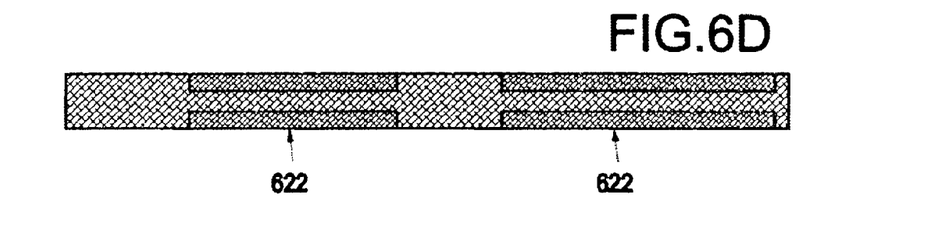
FIG. 6D illustrates a top view of a second layer of the multilayer metal encapsulated MEMS structure of FIG. 6A in an exemplary embodiment of the present invention.
Figure 6E:
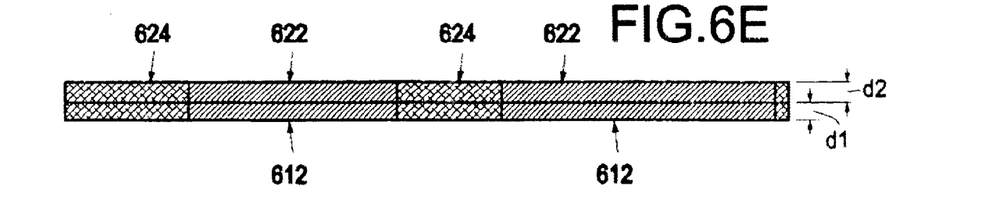
FIG. 6E illustrates a side view of the first and second layers of the multilayer metal encapsulated MEMS structure of FIG. 6A in an exemplary embodiment of the present invention.

Referring to FIGS. 6D–E, in various exemplary embodiments a second layer including a second dielectric layer 624 and a second metal layer 622 may be formed using conventional photomasking processes. A second dielectric layer 624 may be formed over the first metal layer 612. In various exemplary embodiments, the second dielectric layer 624 is patterned to form two side trenches that contact the first metal layer 612, while retaining a central portion of the second dielectric layer 624 between the two side trenches. A second metal layer 622 may then be formed in the two side trenches.

In various exemplary embodiments, areas of the second dielectric layer 624 that surround portions of the multilayered metal encapsulated structure, which is to be released, are removed by various processes well known in the art. These areas may then be filled with release material.

Figure 6F:
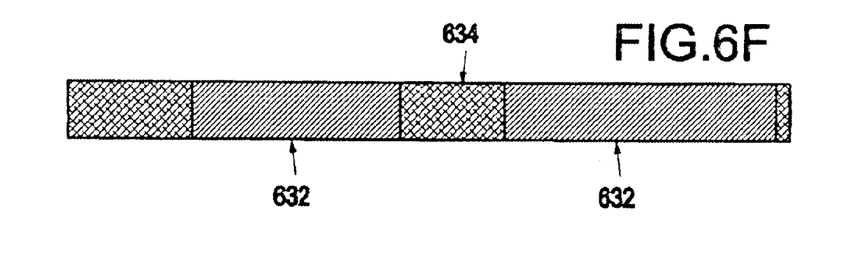
FIG. 6F illustrates a top view of a third layer of the multilayer metal encapsulated MEMS structure of FIG. 6A in an exemplary embodiment of the present invention.
Figure 6G:
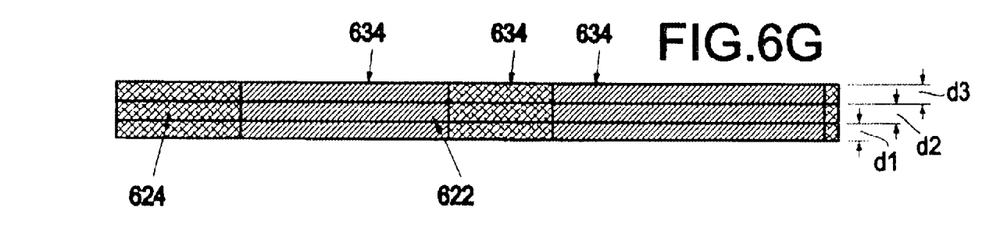
FIG. 6G illustrates a side view of the first, second and third layers of the multilayer metal encapsulated MEMS structure of FIG. 6A in an exemplary embodiment of the present invention.
Figure 6H:
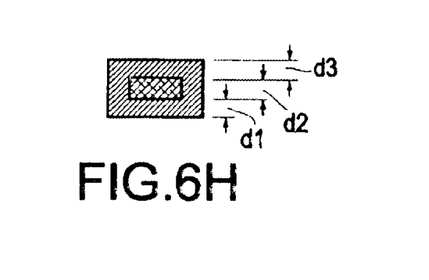
FIG. 6H illustrates a cross sectional view of the multilayer metal encapsulated MEMS structure of FIG. 6A in an exemplary embodiment of the present invention.

Referring to FIGS. 6F–H, in various exemplary embodiments a third metal layer 632 may be formed using conventional photomasking processes. A third dielectric layer may be formed on at least the second metal layer 622 and the central portion of the second dielectric layer 624. In various exemplary embodiments, the third dielectric layer is patterned to form another trench corresponding to the pattern of the first metal layer 612, where the another trench of the third dielectric layer contacts the second metal layer 624. A third metal layer 632 may then be formed within the patterned trench of the third dielectric layer.

In various exemplary embodiments the third dielectric layer may then be further patterned to provide access for additional release material surrounding the multilayered metal encapsulated MEMS structure. The release material may be removed to free the multilayered metal encapsulated MEMS structure, a portion of which is separate from and overlies the first dielectric layer as shown in FIG. 3A.

As shown in FIGS. 6A–H, an exemplary embodiment of an encapsulated MEMS structure containing electrically-isolated lengths of metal encapsulation may also be fabricated as a multilayer metal encapsulated MEMS structure by CMOS compatible methods.

In various exemplary embodiments, a first trench is patterned in a base dielectric layer formed on a semiconductor substrate. A release material may be deposited within the first trench, above which the encapsulated MEMS structure is to be formed. In various exemplary embodiments, an upper surface of the release material is patterned to form at least two separate trenches along the long axis of the first trench. Alternatively, a dielectric layer be formed on the release material and patterned to form at least two separate trenches along the long axis of the first trench.

As shown in FIG. 6C, a first metal layer 612 may be formed within the two separate trenches so as to be contiguous with a first dielectric layer 614.

Referring to FIGS. 6D–E, in various exemplary embodiments a second layer including a second dielectric layer 624 and a second metal layer 622 may be formed using conventional photomasking processes. The second dielectric layer 624 may be formed over first metal layer 612 and that portion of the first dielectric layer, which will form a contiguous isolated portion of the metal encapsulated structure. In various exemplary embodiments, the second dielectric layer 624 is patterned over each of the two separate trenches, containing the first metal layer 612, to form two side trenches that contact the first metal layer 612, while retaining a central portion of the second dielectric layer 624 between the two side trenches. A second metal layer 622 may be formed within the two side trenches for each of the two separate trenches.

In various exemplary embodiments, areas of the second dielectric layer 624 that surround portions of the multilayered metal encapsulated structure, which is to be released, are removed by various processes well known in the art. These areas may then be filled with release material.

Referring to FIGS. 6F–H, in various exemplary embodiments a third metal layer 632 may be formed using conventional photomasking processes. A third dielectric layer may be formed on at least the second metal layer 622 and the central portion of the second dielectric layer 624. In various exemplary embodiments, the third dielectric layer is patterned to form other separate trenches corresponding to the pattern of the first metal layer 612, where the other separate trenches of the third dielectric layer contact the second metal layer 624. A third metal layer 632 may then be formed within the patterned separate trenches of the third dielectric layer.

In various exemplary embodiments the third dielectric layer may then be further patterned to provide access for additional release material surrounding the multilayered metal encapsulated MEMS structure. The release material may be removed to free the multilayered metal encapsulated MEMS structure, a portion of which is separate from and overlies the first dielectric layer as shown in FIGS. 3B and 3C.

Figure 4A:
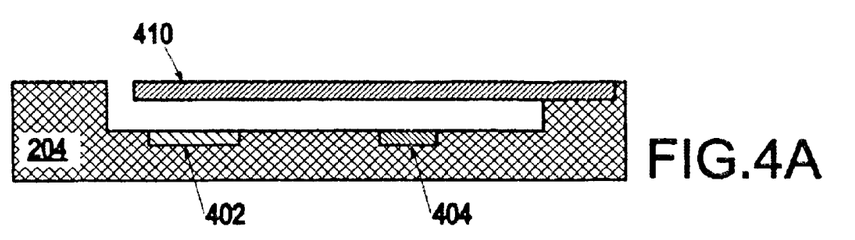
FIG. 4A illustrates an encapsulated cantilever beam 410, which overlies a grounding plate 404 and switch contacts 402 in an exemplary embodiment of the present invention.

In various exemplary embodiments, one or more switch contacts 402 or grounding plates 404 of various RF switch configurations may be located beneath the encapsulated cantilever beam 410 on the dielectric layer 204 as shown in FIG. 4A, or the location of one or more switch contacts 402 or grounding plates 404 may correspond to an electrically isolated lengths of the encapsulated cantilever beam 412.

Figure 4B:
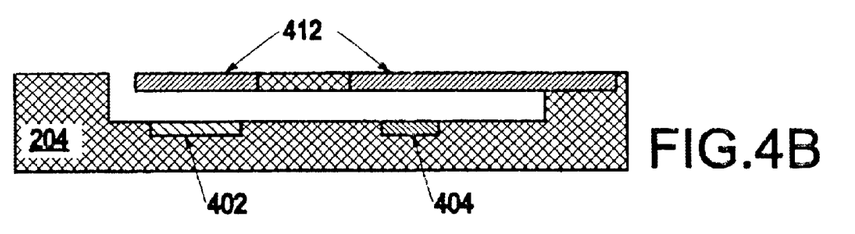
FIG. 4B illustrates an encapsulated cantilever beam that provides two lengths of electrically conductive encapsulation separated by a length of a dielectric material, where one encapsulated length overlies a grounding plate 404 and the other encapsulated length overlies a switch contact 402 in an exemplary embodiment of the present invention.

In various exemplary embodiments, a cantilever beam may contain one or more electrically isolated encapsulated portions, which overlie a grounding plate 404 and a switch contact 402, respectively, as shown in FIG. 4B.

Figure 5A:
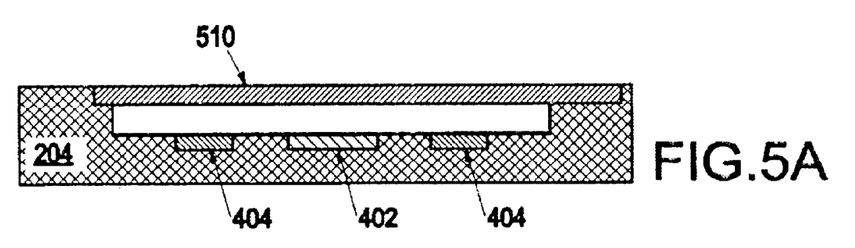
FIG. 5A illustrates an encapsulated beam that is supported at both ends, where the encapsulated beam overlies two grounding plates 404 and one switch contacts 402 in an exemplary embodiment of the present invention.

In various exemplary embodiments, a beam 510, encapsulated along its entire length, may be supported at both ends by the dielectric layer 204 as shown in FIG. 5A. The beam 510 may overlie one or more switch contacts 402 or grounding plates 404 located on the dielectric layer 204 in order to form various configurations of RF switches.

Figure 5B:
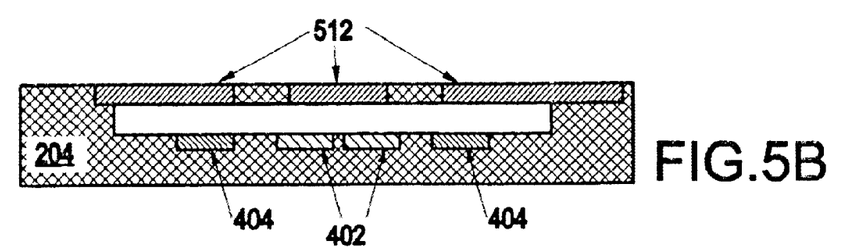
FIG. 5B illustrates an encapsulated beam that provides three lengths of electrically conductive encapsulation separated by two lengths of a dielectric material and that overlies two grounding plates 404 and two switch contacts 402 in an exemplary embodiment of the present invention.

In various exemplary embodiments, a beam having a number of electrically isolated lengths of encapsulated portions 512, may be supported at both ends by the dielectric layer 204 as shown in FIG. 5B. The location of one or more switch contacts 402 or grounding plates 404 may correspond to one or more electrically isolated lengths of the encapsulated beam in order to form various configurations of RF switches. For example, a first length of an electrically isolated metal encapsulated portion of the encapsulated MEMS structure may be contact a control voltage, while a second length of an electrically isolated metal encapsulated portion may contact an RF input signal.

Figure 7A:
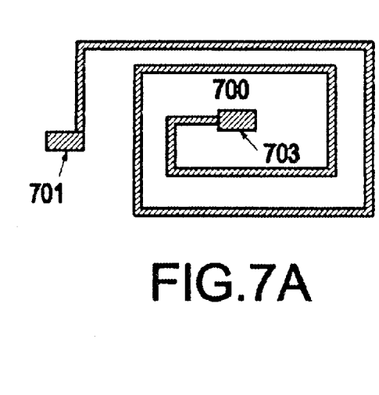
FIG. 7A illustrates a plan view of an encapsulated MEMS structure that forms an inductive coil in an exemplary embodiment of the present invention.
Figure 7B:
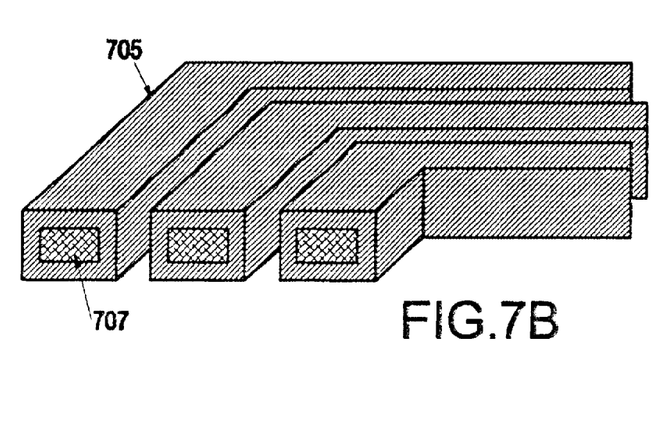
FIG. 7B illustrates a cross-sectional view of a portion of an encapsulated MEMS structure that forms an inductive coil in an exemplary embodiment of the present invention.

FIG. 7A illustrates, in a plan view, an exemplary embodiment of an encapsulated MEMS structure that forms an inductive coil 700 according to the methods of fabrication and modifications of these methods, obvious to one of ordinary skill in the art, disclosed above and in either FIGS. 2A–I or 6A–H. In various exemplary embodiments, supports formed by the dielectric layer 204 for the encapsulated portion of the MEMS structure may be located at the outer end 701 of the inductive coil and the inner end 703 of the inductive coil 700 as shown in FIG. 7A. FIG. 7B illustrates the encapsulation layer 705 encapsulating the inner core layer 707 between the inner end 701 and the outer end 703 of the encapsulated MEMS inductive coil 700.

To provide enhanced inductive characteristics, either one of the encapsulation layer 705 or the inner core layer 703 may be formed of ferromagnetic materials, while the other layer may be formed of a material having complementary physical characteristics, such as, for example, mechanical strength and/or high electrical conductivity. The ferromagnetic materials used may include but are not limited to Permalloy, an 80/20 alloy of nickel and iron; nickel, cobalt, and alnico, an aluminum-nickel-cobalt alloy, which may be deposited and patterned by conventional CMOS fabrication processes. Materials, such as, polysilicon, various metals, such as, copper, tantalum, gold, and aluminum, and various metal nitrides, such as, tantalum nitride and titanium nitride, may be used to provide complementary physical characteristics to the encapsulated portion of the MEMS inductive coil.

In various exemplary embodiments, one or more plates formed of ferromagnetic materials or inductive coils may be located on the surface of the dielectric layer 204, located beneath the encapsulated portion of the MEMS inductive coil, such that mechanical deformation of the encapsulated portion of the MEMS inductive coil results when a threshold current flows through the encapsulated portion of the MEMS inductive coil. Such mechanical deformation may be used to form inductively-activated switches.

While the invention has been described in terms of preferred embodiments, those skilled in the art will recognize that the invention can be practiced with modification within the spirit and scope of the appended claims.

What is claimed is:

1. A method of fabricating an encapsulated micro electromechanical system (MEMS), comprising:
    forming a dielectric layer on a semiconductor substrate;
    patterning an upper surface of the dielectric layer to form a first trench;
    forming a release material within the first trench;
    patterning an upper surface of the release material to form a second trench;
    forming a first encapsulating layer within the second trench, the first encapsulating layer including sidewalls;
    forming a core layer within the first encapsulating layer; and
    forming a second encapsulating layer above the core layer, the second encapsulating layer being connected to the sidewalls of the first encapsulating layer.

2. The method of fabricating the encapsulated MEMS of claim 1, wherein each of the first encapsulating layer and the second encapsulating layer comprises a barrier metal from the group of gold, platinum, palladium, iridium, tungsten, tungsten nitride, tantalum, tantalum nitride, titanium, titanium nitride and nickel and the core layer comprises a semiconductor dielectric material.

3. The method of fabricating the encapsulated MEMS of claim 1, further comprising forming a metal layer between the first encapsulating layer and the core layer.

4. The method of fabricating the encapsulated MEMS of claim 3, wherein the metal layer includes sidewalls that are connected to the second encapsulating layer.

5. The method of fabricating the encapsulated MEMS of claim 4, wherein forming the metal layer, includes:
    depositing an initial metal layer including sidewalls on the first encapsulating layer;
    depositing a stop layer on exposed surfaces of at least the first encapsulating layer and the sidewalls of the initial metal layer;
    removing the stop layer located above the sidewalls of the initial metal layer; and
    recessing the sidewalls of the initial metal layer and of that portion of the stop layer, which adheres to the sidewalls of the initial metal layer.

6. The method of fabricating the encapsulated MEMS of claim 3, wherein the metal layer comprises a highly conductive metal from the group of copper, gold and aluminum.

7. The method of fabricating the encapsulated MEMS of claim 3, wherein forming the core layer, includes:
    depositing a stop layer on exposed surfaces of at least the first encapsulating layer and the metal layer;
    depositing a semiconductor dielectric material on the stop layer;
    planarizing the semiconductor dielectric material to the stop layer; and
    recessing the semiconductor dielectric material to a level beneath that of the upper surface of the release material.

8. The method of fabricating the encapsulated MEMS of claim 1, further comprising forming at least one switch contact and at least one grounding plate on that portion of the dielectric layer that forms a bottom surface of the first trench.

9. The method of fabricating the encapsulated MEMS of claim 1, wherein removing the release material results in forming a cantilever beam, including at least the first encapsulating layer, the core layer, and the second encapsulating layer, over a bottom surface of the first trench.

10. The method of fabricating the encapsulated MEMS of claim 1, wherein removing the release material results in forming a beam, supported at both ends, over a bottom surface of the first trench.

11. The method of fabricating the encapsulated MEMS of claim 1, wherein the first trench and the second trench form coil patterns having two ends, in which an encapsulated inductive coil is formed, and removing the release material results in the encapsulated inductive coil being positioned over a lower portion of the dielectric layer and being supported at both ends by higher portions of the dielectric layer.

12. The method of fabricating the encapsulated MEMS of claim 1, wherein the first encapsulating layer and the second encapsulating layer comprise a ferromagnetic material and the core layer comprises a semiconductor dielectric material or a metal.

13. The method of fabricating the encapsulated MEMS of claim 1, wherein the first encapsulating layer and the second encapsulating layer comprises a semiconductor dielectric material or a metal and the core layer comprises a ferromagnetic material.

14. A method of fabricating a multilayered metal encapsulated structure for a micro electro-mechanical system (MEMS), comprising:
   forming a first dielectric layer on a semiconductor substrate;
   patterning an upper surface of the first dielectric layer to form a trench;
   forming a release material within the trench;
   forming a first metal layer on the release material;
   forming a second dielectric layer on at least the first metal layer;
   patterning the second dielectric layer to form two side trenches, the two side trenches contacting the first metal layer while retaining a central portion of the second dielectric layer between the two side trenches;
   forming a second metal layer within the two side trenches;
   removing areas of the second dielectric layer that surround portions of the multilayered metal encapsulated structure, which are to be released;
   filling the areas with the release material;
   forming a third dielectric layer on at least the second metal layer and the central portion of the second dielectric layer;
   patterning another trench in the third dielectric layer that corresponds to a pattern of the first metal layer, the another trench contacting the second metal layer;
   forming a third metal layer within the another trench of the third dielectric layer;
   patterning the third dielectric layer to provide access to the release material; and
   removing the release material to provide the multilayered metal encapsulated structure, a portion of which is separate from and overlies the first dielectric layer.

15. The method of fabricating the multilayered metal encapsulated structure for a MEMS of claim 14, wherein each of the first metal layer, the second metal layer and the third metal layer comprises a barrier metal from the group of gold, platinum, palladium, iridium, tungsten, tungsten nitride, tantalum, tantalum nitride, titanium, titanium nitride and nickel.

16. The method of fabricating the multilayered metal encapsulated structure for a MEMS of claim 14, further comprising forming at least one switch contact and at least one grounding plate on that portion of the first dielectric layer that forms a bottom surface of the trench.

17. The method of fabricating the multilayered metal encapsulated structure for a MEMS of claim 14, wherein removing the release material results in forming a cantilever beam over a bottom surface of the first trench.

18. The method of fabricating the multilayered metal encapsulated structure for a MEMS of claim 14, wherein removing the release material results in forming a beam, supported at both ends, over a bottom surface of the first trench.

19. The method of fabricating the multilayered metal encapsulated structure for a MEMS of claim 14, wherein the first trench forms a coil pattern having two ends, and each of the first metal layer, the second metal layer and the third metal layer comprises a ferromagnetic material.

20. The method of fabricating the multilayered metal encapsulated structure for a MEMS of claim 14, wherein removing the release material results in forming an inductive coil over a lower portion of the dielectric layer, in which the inductive coil is supported at both ends.

21. A method of fabricating a multilayered metal encapsulated structure, including an electrically-isolated metal encapsulation, for a micro electro-mechanical system (MEMS), comprising:
   forming a first dielectric layer on a semiconductor substrate;
   patterning an upper surface of the first dielectric layer to form a first trench;
   forming a release material within the first trench;
   patterning an upper surface of the release material to form at least two separate second trenches along the long axis of the first trench;
   forming a first metal layer within the at least two separate second trenches;
   forming a second dielectric layer on at least the first metal layer;
   patterning the second dielectric layer over each of the at least two separate second trenches to form two side trenches, the two side trenches contacting the first metal layer while retaining a central portion of the second dielectric layer between the two side trenches;
   forming a second metal layer within the two side trenches for each of the at least two separate trenches;
   removing areas of the second dielectric layer that surround portions of the multilayered metal encapsulated structure, which are to be released;
   filling the areas with the release material;
   forming a third dielectric layer on at least the second metal layer and the central portion of the second dielectric layer;
   patterning a third trench in the third dielectric layer that corresponds to a pattern of the first metal layer, the third trench contacting the second metal layer;
   forming a third metal layer within the third trench;
   patterning the third dielectric layer to provide access to the release material; and
   removing the release material to provide the multilayered metal encapsulated structure, a portion of which is separate from and overlies the first dielectric layer.

22. The method of fabricating the multilayered metal encapsulated structure, including an electrically-isolated metal encapsulation, for a MEMS of claim 21, wherein each of the first metal layer, the second metal layer and the third metal layer comprises a barrier metal from the group of gold, platinum, palladium, iridium, tungsten, tungsten nitride, tantalum, tantalum nitride, titanium, titanium nitride and nickel.

23. The method of fabricating the multilayered metal encapsulated structure, including an electrically-isolated metal encapsulation, for a MEMS of claim 21, further comprising forming at least one switch contact and at least one grounding plate on those portions of the dielectric layer that form bottom surfaces of the at least two separate second trenches.

24. The method of fabricating the multilayered metal encapsulated structure, including an electrically-isolated metal encapsulation, for a MEMS of claim 21, wherein removing the release material results in forming a cantilever beam over at least bottom surfaces of the first trench.

25. The method of fabricating the multilayered metal encapsulated structure, including an electrically-isolated metal encapsulation, for a MEMS of claim 21, wherein removing the release material results in forming a beam over that is supported at both ends over a bottom surface of the first trench.

26. An encapsulated MEMS, comprising:
   a dielectric layer formed on a substrate, the dielectric layer including a portion of lesser thickness and at least one portion of a greater thickness;
   an encapsulated beam, in which at least one of both ends of the encapsulated beam is supported above the portion of the dielectric layer having a lesser thickness by the corresponding at least one portion of the dielectric layer having a greater thickness;
   a encapsulating layer that encapsulates the encapsulated beam; and
   a core layer formed within the encapsulating layer.

27. The encapsulated MEMS of claim 26, further comprising:
   a metal layer formed between the encapsulating layer and the core layer; and
   a stop layer formed between the metal layer and the core layer.

28. The encapsulated MEMS of claim 26, wherein the metal layer and the stop layer include sidewalls that are connected to the encapsulating layer.

29. The encapsulated MEMS of claim 26, further comprising:
   at least one switch contact and at least one grounding plate on the portion of the dielectric layer having a lesser thickness.

30. The encapsulated MEMS of claim 26, wherein the encapsulated beam comprises an encapsulated portion, which includes the encapsulating layer and the core layer, and an electrically-isolating portion, which includes the core layer and is devoid of the encapsulating layer.

31. The encapsulated MEMS of claim 26, wherein the encapsulated beam forms a coil pattern, and either the core layer or the encapsulating layer comprises a ferromagnetic material.

* * * * *